(12) United States Patent
Feist et al.

(10) Patent No.: US 8,604,336 B2
(45) Date of Patent: Dec. 10, 2013

(54) PHOTOVOLTAIC DEVICE WITH TRANSPARENT, CONDUCTIVE BARRIER LAYER

(75) Inventors: Rebekah K. Feist, Midland, MI (US); Marty W. DeGroot, Midland, MI (US); Todd R. Bryden, Midland, MI (US); Joseph George, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 347 days.

(21) Appl. No.: 13/005,422

(22) Filed: Jan. 12, 2011

(65) Prior Publication Data
US 2011/0192454 A1    Aug. 11, 2011

Related U.S. Application Data

(60) Provisional application No. 61/302,667, filed on Feb. 9, 2010.

(51) Int. Cl.
*H01L 31/00* (2006.01)
*H01L 21/00* (2006.01)

(52) U.S. Cl.
USPC ............................................. 136/256; 438/95

(58) Field of Classification Search
CPC ..................... H01L 31/0216; H01L 31/02161; H01L 31/0392
USPC ..................... 136/255, 256; 438/95
See application file for complete search history.

(56) References Cited

U.S. PATENT DOCUMENTS

| | | | |
|---|---|---|---|
| 5,028,274 A | 7/1991 | Basol et al. | |
| 5,501,786 A | 3/1996 | Gremion et al. | |
| 5,626,688 A | 5/1997 | Probst et al. | |
| 5,676,766 A | 10/1997 | Probst et al. | |
| 6,259,016 B1 * | 7/2001 | Negami et al. | 136/265 |
| 6,566,162 B2 * | 5/2003 | Niki et al. | 438/95 |
| 7,262,133 B2 | 8/2007 | Chen et al. | |

(Continued)

FOREIGN PATENT DOCUMENTS

| | | |
|---|---|---|
| EP | 0 881 695 | 12/1998 |
| WO | WO 01/39277 | 5/2001 |
| WO | WO 2007/088146 | 8/2007 |

OTHER PUBLICATIONS

Progress in Photovoltaics: Research and Applications, Romeo et al., "Development of Thin-film Cu(In, Ga)Se$_2$ and CdTe Solar Cells", vol. 12, p. 93-111, (2004).

(Continued)

*Primary Examiner* — Jennifer Michener
*Assistant Examiner* — Eli Mekhlin
(74) *Attorney, Agent, or Firm* — Kagan Binder, PLLC

(57) ABSTRACT

The present invention provides strategies for providing photovoltaic devices that are more resistant to moisture and/or oxygen degradation and the accompanying migration of key elements such as Na, Li, and the lanthanoid series of elements from the absorber layer and that have enhanced service life and improved performance. These strategies are particularly useful in the fabrication of chalcogenide-based photovoltaic devices such as chalcogenide-based solar cells. These strategies incorporate a barrier region between the photovoltaic absorber region and the front side collection grid. The barrier region keeps moisture and/or oxygen from the absorber layer and contains key elements such as Na, Li, and Ln in the absorber layer. As a result, the absorber layer retains its performance capabilities for an extended period of time.

14 Claims, 3 Drawing Sheets

(56) References Cited

U.S. PATENT DOCUMENTS

| | | |
|---|---|---|
| 7,288,782 B1 | 10/2007 | Avanzino et al. |
| 7,375,026 B2 | 5/2008 | Rhodes |
| 7,375,031 B2 | 5/2008 | Preusse et al. |
| 2002/0043279 A1* | 4/2002 | Karg .............................. 136/262 |
| 2007/0193623 A1 | 8/2007 | Krasnov |
| 2008/0023336 A1 | 1/2008 | Basol |
| 2008/0053519 A1 | 3/2008 | Pearce et al. |
| 2008/0128019 A1 | 6/2008 | Lopatin et al. |
| 2008/0169025 A1 | 7/2008 | Basol et al. |
| 2008/0210295 A1 | 9/2008 | Basol |
| 2008/0271781 A1 | 11/2008 | Kushiya et al. |
| 2009/0126791 A1 | 5/2009 | Lu et al. |

OTHER PUBLICATIONS

Plasma Process. Polym., Wolf et al., Moisture Barrier Films Deposited on PET by ICPECVD of $SiN_x$, vol. 4, p. S185-S189, (2007).

* cited by examiner

US 8,604,336 B2

PHOTOVOLTAIC DEVICE WITH TRANSPARENT, CONDUCTIVE BARRIER LAYER

PRIORITY

The present nonprovisional patent application claims priority under 35 U.S.C. §119(e) from U.S. Provisional patent application having Ser. No. 61/302,667 filed on Feb. 9, 2010, by Feist et al. and titled PHOTOVOLTAIC DEVICE WITH TRANSPARENT, CONDUCTIVE BARRIER LAYER, wherein the entirety of said provisional patent application is incorporated herein by reference.

FIELD OF THE INVENTION

The present invention relates to photovoltaic devices of the type incorporating a frontside electrical collector, typically a conductive grid, that facilitates the ease of making external electrical connections, and more particularly to chalcogen-based photovoltaic devices in which a barrier layer is interposed between an absorber layer and the frontside electrical collector.

BACKGROUND OF THE INVENTION

Both n-type chalcogenide compositions and/or p-type chalcogenide compositions have been incorporated into components of photovoltaic devices. The p-type chalcogenide compositions have been used as the photovoltaic absorber region in these devices. Illustrative p-type, photovoltaically active chalcogenide compositions often include sulfides and/or selenides of at least one or more of Aluminum (Al), copper (Cu), indium (In), and/or gallium (Ga). More typically at least two or even all three of Cu, In, and Ga are present. Such materials are referred to as CIAS, CIS, CISS, CIGS, and/or CIGSS compositions, or the like (collectively CIGS compositions hereinafter).

Absorbers based upon CIGS compositions offer several advantages. As one, these compositions have a very high cross-section for absorbing incident light. This means that a very high percentage of incident light can be captured by CIGS-based absorber layers that are very thin. For example, in many devices, CIGS-based absorber layers have a thickness in the range of from about 1 μm to about 3 μm. These thin layers allow devices incorporating these layers to be flexible. This is in contrast to crystalline silicon-based absorbers. Crystalline silicon-based absorbers have a lower cross-section for light capture and generally must be much thicker to capture the same amount of incident light. Crystalline silicon-based absorbers tend to be rigid, not flexible. The n-type chalcogenide compositions, particularly those incorporating at least cadmium, have been used in photovoltaic devices as buffer layers. These materials generally have a band gap that is useful to help form a p-n junction proximal to the interface between the n-type and p-type materials. Like p-type materials, n-type chalcogenide layers can be thin enough to be used in flexible photovoltaic devices. These chalcogenide based photovoltaic cells frequently also include other layers such as transparent conductive layers and window layers. Chalcogenide-based solar cells are prone to degradation due to moisture and/or oxygen-induced degradation. Moisture and oxygen are known to facilitate the migration of various beneficial elements such as sodium (Na), lithium (Li), and the lanthanoid series (Ln) of elements, from a chalcogenide-containing absorber layer. This migration creates defects in the absorber layer that negatively impacts device performance.

To protect the absorber layer cells from this detrimental degradation, one or more barrier films can be deposited over the devices. Unfortunately, these barrier films have not proven to be entirely satisfactory. As a result, improved barrier strategies are desirable.

SUMMARY OF THE INVENTION

The present invention provides chalcogenide and preferably CIGS-based photovoltaic cells that are more resistant to moisture and/or oxygen degradation and to migration of key elements such as sodium (Na), lithium (Li), and the lanthanoid series (Ln) from the absorber layer. As a result, they have enhanced service life and increased device efficiency.

The present invention provides solar devices that incorporate a transparent barrier layer that serves to keep moisture and/or oxygen from the absorber layer and contains key elements such as Na, Li, and Ln within the absorber layer. As a result, the absorber layer retains its performance capabilities for an extended period of time. The barrier layer is positioned between the absorber layer and the frontside electrical collector, preferably a conductive grid. In some embodiments of the invention, the barrier is located between the absorber and a transparent conductive layer, typically a transparent conductive oxide. In other embodiments, the barrier is positioned between the transparent conductive layer and the collection grid. In certain embodiments, the barrier can serve as a functional or active layer in the devices. The barrier in many embodiments is at least somewhat conductive and is transparent to the relevant wavelengths of radiation to which the absorber layer is active.

In one aspect, the present invention provides a photovoltaic device comprising:

a) a substrate comprising a backside electrical contact for the device;

b) at least one chalcogenide-containing photovoltaic absorber layer, the chalcogenide-containing absorber layer incorporating at least one constituent selected from sodium (Na), lithium (Li), and the lanthanoid series (Ln), or a combination thereof which absorber layer is electrically connected to the backside electrical contact;

c) a frontside electrical collector; and d) a transparent barrier located between the absorber layer and the frontside electrical collector, the first barrier layer inhibiting migration of the at least one constituent selected from sodium (Na), lithium (Li), and the lanthanoid series (Ln), or a combination thereof from the chalcogenide-containing absorber layer.

Preferably, the frontside electrical collector preferably comprises a front side collection grid comprising at least one front side electrical contact located over and electrically connected to a transparent conductive layer, and the first transparent barrier layer is located between the chalcogenide-containing absorber layer and the transparent conductive layer or between the transparent conductive layer and the front side collection grid, the first barrier layer inhibiting migration of the at least one constituent selected from sodium (Na), lithium (Li), and the lanthanoid series (Ln), or a combination thereof from the chalcogenide-containing absorber layer.

In another aspect, the present invention provides a method of making a photovoltaic device, comprising the steps of:

a) providing a substrate having a light incident surface and a backside surface, the backside surface having a backside electrical contact thereon, the substrate further having at least one chalcogenide-containing photovoltaic absorber layer electrically connected to the backside electrical contact, the chalcogenide-containing absorber layer incorporating at least one constituent selected from Na, Li, one of the lanthanoid series of elements (Ln) or a combination thereof;

b) causing at least one transparent conductive layer to be formed over the chalcogenide-containing absorber layer;

c) forming a collection grid comprising at least one front side electrical contact on the light incident surface, is the collection grid being electrically connected to the transparent conductive layer; and d) causing a first transparent barrier layer to be formed between the chalcogenide-containing absorber layer and the transparent conductive layer or between the transparent conductive layer and the front side collection grid, the first barrier layer inhibiting migration of the at least one constituent selected from Na, Li, Ln, or a combination thereof from the chalcogenide-containing absorber layer.

In embodiments of the invention, the transparent conductive layer may comprise either a thin metal layer or a conducting oxide.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

Figure 1:
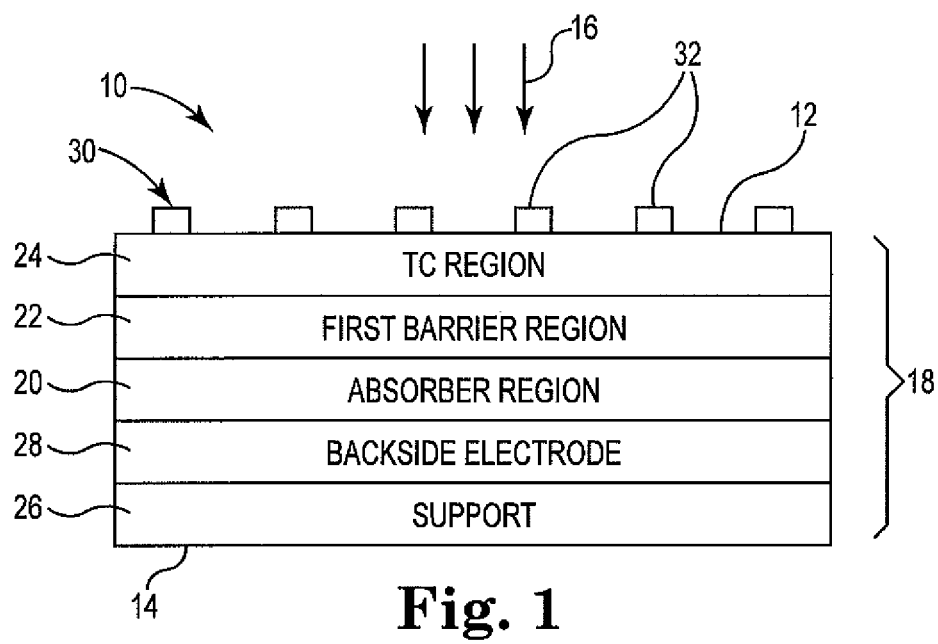
FIGS. 1-5 are schematic cross-section views of various embodiments of photovoltaic devices according to principles of the present invention.
Figure 2:
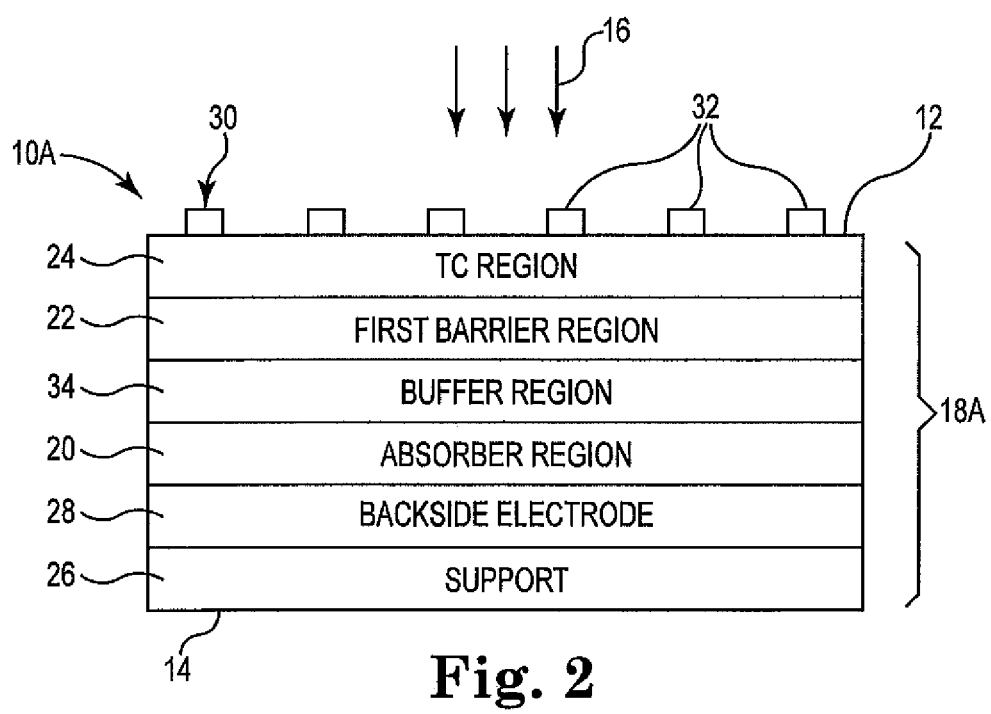

FIG. 1 schematically shows one embodiment of a photovoltaic device 10 of the present invention. Device 10 desirably is flexible to allow it to be mounted to surfaces incorporating some curvature. In preferred embodiments, device 10 is sufficiently flexible to be wrapped around a mandrel having a diameter of 50 cm, preferably about 40 cm, more preferably about 25 cm without cracking at a temperature of 25° C. Device 10 includes a light incident face 12 that receives light rays 16 and a backside face 14.

Device 10 includes a substrate 18 that incorporates a chalcogenide-containing photovoltaic absorber region 20. Region 20 can be a single integral layer as illustrated or can be formed from one or more layers. The region 20 absorbs light energy embodied in the light rays 16 and then photovoltaically converts this light energy into electric energy.

The chalcogenide absorber region 20 preferably incorporates at least one IB-IIIB-chalcogenide, such as IB-IIIB-selenides, IB-IIIB-sulfides, and IB-IIIB-selenides-sulfides that include at least one of copper, indium, and/or gallium. In many embodiments, these materials are present in polycrystalline form. Advantageously, these materials exhibit excellent cross-sections for light absorption that allow region 20 to be very thin and flexible. In illustrative embodiments, a typical absorber region 20 may have a thickness in the range from about 1 μm to about 5 μm, preferably about 2 μm to about 3 μm.

Representative examples of such IB-IIIB-chalcogenides incorporate one or more of copper, indium, and/or gallium in addition to selenium and/or sulfur. Some embodiments include sulfides or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, copper indium aluminum selenides and copper indium gallium sulfide selenides (all of which are referred to herein as CIGS) materials. In representative embodiments, CIGS materials with photovoltaic properties may be represented by the formula $CuIn_{(1-x)}Ga_xSe_{(2-y)}S_y$ where x is 0 to 1 and y is 0 to 2. The copper indium selenides and copper indium gallium selenides are preferred.

The chalcogenide absorber may be doped with other materials such as Na, Li, one of the lanthanoid series of elements (Ln) or a combination thereof as is known in the art. The lanthanoid series of elements (previously lanthanide) series comprises the fifteen elements with atomic numbers 57 through 71, from lanthanum (La) to Lutetium (Lu). Preferred members of the lanthanoid series of elements for inclusion in the absorber layer include La or Eu. Beneficial effects of the inclusion of Na, Li or the lanthanoid series of elements include increases in p-type conductivity, texture, and average grain size. Doping of the chalcogenide absorber layer can be achieved in several ways including diffusion of such metal ions from the substrate or an adjacent layer deposited prior to CIGS formation or diffusion from a solution containing the dopant following CIGS formation. In preferred embodiments, sodium doping of the CIGS layer is achieved via diffusion from a soda-lime glass substrate or from a layer of sodium fluoride deposited between the back contact layer (Mo) and the chalcogenide-containing absorber.

The absorber region 20 may be formed by any suitable method using a variety of one or more techniques such as evaporation, sputtering, electrodeposition, spraying, and sintering. One preferred method is co-evaporation of the constituent elements from one or more suitable targets, where the individual constituent elements are thermally evaporated on a hot surface coincidentally at the same time, sequentially, or a combination of these to form region 20. After deposition, the deposited materials may be subjected to one or more further treatments to finalize the region 20. In many embodiments, CIGS materials have p-type characteristics.

Substrate 18 further incorporates a first barrier region 22. First barrier region 22 can be a single integral layer as illustrated or can be formed from one or more layers. First barrier region 22 serves to block the intrusion of moisture and/or oxygen into, and the migration of Na, Li, one of the lanthanoid series of elements (Ln) or a combination thereof from, the chalcogenide-containing absorber region 20.

The first barrier region 22 is formed over the chalcogenide-containing absorber 20 prior to formation of the TC (transparent conductive) region 24. Advantageously, the methodologies of the present invention enhance the resistance of the absorber 20 to the negative effects of moisture and/or oxygen in the context of chalcogenide-based photovoltaic devices and in particular flexible CIGS-based devices. This methodology provides enhanced protection against migration of desired elements from the absorber so that device performance is maintained over time.

In more detail, the first barrier region 22 is formed from one or more suitable materials that are sufficiently transparent in the near infrared and visible range. Preferred materials have a transmittance of greater than about 80% between about 400 and 1300 nm. Additionally, representative embodiments of the materials used in the first barrier region 22 are somewhat conductive, having a resistivity in the range of about 0.01 to about 100 Ohm-cm, preferably about 0.1 to about 100 Ohm-cm.

In many embodiments, first barrier region 22 is characterized by a water vapor transmission rate (WVTR) in the range of $10^0$ to about $10^{-5}$ g/m$^2$·day, but is preferably less than 0.1 g/m$^2$·day. Most preferably the WTVR is less than 0.01 g/m$^2$·day. The WVTR for a material may be determined according to the methodology described in ASTM E 96 or in other tests such as the calcium test (Wolf et al. Plasma Processes and Polymers, 2007, 4, S185-8189). According to some embodiments the barrier also serves as an oxygen barrier.

The first barrier region 22 may be formed from one or more of a variety of materials. First barrier region 22 may be formed from materials selected from the group of nitrides, carbides or oxides of at least one of Ti, Ta, Si and Sn and combinations thereof. In one preferred embodiment, the barrier material is at least one nitride or carbide of Ti or Ta or combinations thereof. These materials may be represented by the formula $TiN_x$, $TiC_x$, $TaC_x$, or $TaN_x$. In another preferred embodiment, the barrier region 22 is at least one material selected from $TiO_2$ or $SnO_2$ or a combination thereof. These embodiments provide excellent resistance to moisture and/or oxygen intrusion into, and the migration of desired elements from, the chalcogenide-containing absorber. In some embodiments, first barrier region 22 may be formed from two or more sublayers.

The first barrier region 22 may have a wide range of thicknesses. However, if it is too thin, then the resistance to moisture and/or oxygen intrusion may not be as robust as might be desired with the result that the migration of the beneficial elements may be too great. If too thick, then transparency may unduly suffer without providing sufficient extra performance. Balancing these concerns, illustrative embodiments of first barrier region 22 may have a thickness of less than about 500 nm, preferably less than about 200 nm, more preferably still less than about 100 nm, yet more preferably less than about 50 nm, and most preferably less than about 20 nm. Additionally, illustrative embodiments of the first barrier layer have a thickness of greater that about 5 nm.

In specific illustrative embodiments, first barrier region 22 is preferably from about 5 to about 20 nm thick when $TiN_x$, $TiC_x$, $TaC_x$, or $TaN_x$ or a combination thereof comprises the region 22, and from about 10 to about 150 nm thick when $TiO_2$ or $SnO_2$ or a combination thereof comprises the barrier region 22.

In addition to the above-mentioned materials, the first barrier layer 22 may also include other materials such as n-type semiconductor materials. For example, barrier 22 may include selenides, sulfides, and/or oxides of one or more of cadmium, zinc, lead, indium, tin, and combinations of these. The inclusion of such additional materials in first barrier region 22 gives it multiple functionality. For example, barrier region 22 can serve as a barrier and as an active region such as a buffer and/or window region and can eliminate the need to add additional layers to serve as a barrier and/or window layer.

The first barrier region 22 can be formed on the absorber 20 in a variety of ways. According to one representative methodology, the first barrier region 22 is deposited on the solar cell by a low temperature method carried out at less than about 200° C., preferably less than about 150° C., more preferably less than about 100° C. The temperature in this context refers to the temperature at the surface where deposition is occurring. Preferably, the first barrier region 22 is deposited via magnetron sputtering. Where a preferred $TaN_x$ barrier layer is to be formed, the barrier layer preferably is deposited via reactive magnetron sputtering using a Ta target and a mixture of nitrogen ($N_2$) and argon gas. The mole fraction of $N_2$ in the gas feed is preferably more than 0.1, more preferably more than 0.2 and yet more preferably more than 0.6 but preferably less than 1, more preferably less than 0.9. Prior to the deposition, a suitable base pressure in the chamber is in the range from about $1 \times 10^{-8}$ to about $1 \times 10^{-5}$ Torr. The operating pressure at which sputtering occurs desirably is in the range from about 2 mTorr to about 10 mTorr. When these sputtering conditions are used to form first barrier region 22, an interstitial, relatively thin sublayer may form proximal to the interface between absorber region 20 and the first barrier region 22.

As an option, the first barrier region 22 also may be prepared by other methodologies, including but not limited to low temperature vacuum methods known to those skilled in the art including chemical vapor deposition (CVD), plasma-enhanced chemical vapor deposition (PECVD), atomic layer deposition (ALD) and others.

In addition to absorber region 20 and first barrier region 22, substrate 18 may also include one or more other components including transparent conductive (TC) region 24, support 26, and backside electrical contact region 28. As shown, each of these regions can be a single integral layer as illustrated or can be formed from one or more layers.

Figure 3:
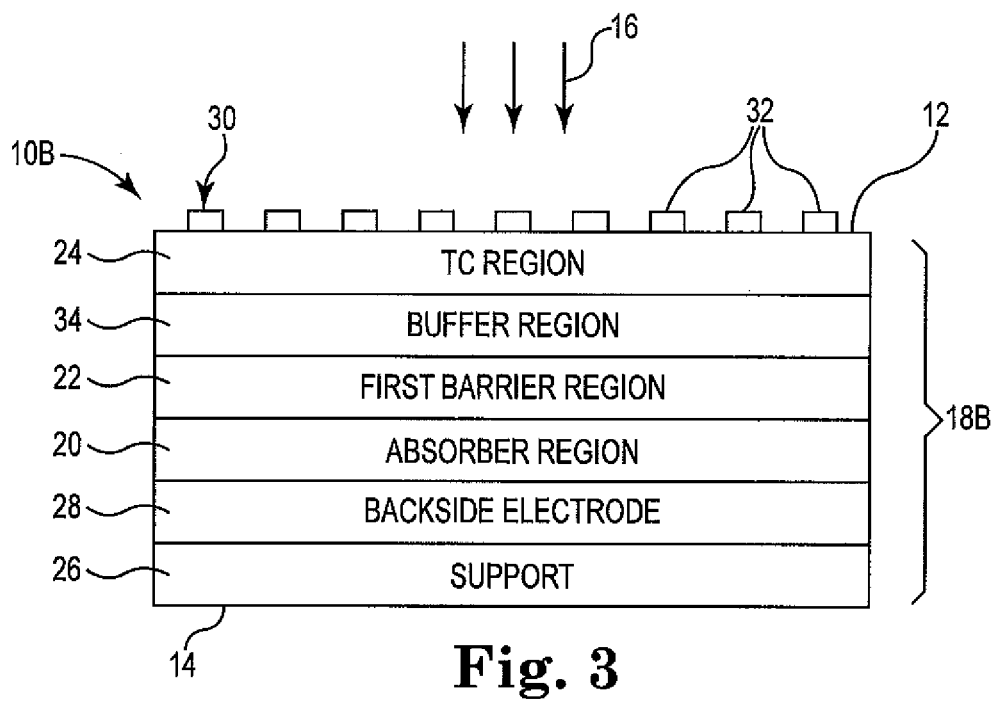
Figure 4:
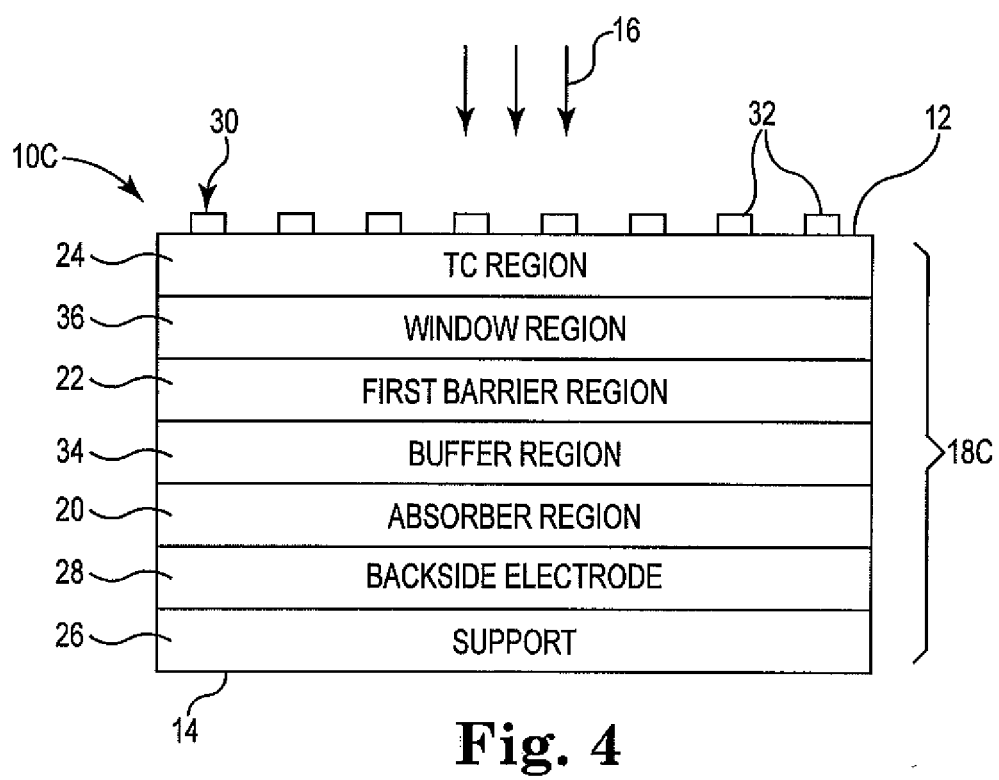

The TC region 24 is positioned above the first barrier region 22. In many suitable embodiments, the TC layer has a thickness in the range from about 10 nm to about 1500 nm, preferably about 150 nm to about 200 nm. As shown, the TC region 24 is in contact with the window region 26. As an example of another option, TC region 24 might be in direct contact with a buffer region 34 (FIG. 3). One or more intervening layers optionally may be interposed for a variety of reasons such as to promote adhesion, enhance electrical performance, or the like.

A wide variety of transparent conducting oxides (TCO) or combinations of these may be incorporated into the transparent conductive region 24. Examples include fluorine-doped tin oxide, tin oxide, indium oxide, indium tin oxide (ITO), aluminum doped zinc oxide (AZO), zinc oxide, combinations of these, and the like. In one illustrative embodiment, the transparent conductive region 24 is indium tin oxide. TCO layers are conveniently formed via sputtering or other suitable deposition technique.

The transparent conductive region 24 alternatively may be a very thin metal film (e.g., a metal film having a thickness greater than about 5 nm and more preferably greater than about 30 nm. Additionally, the transparent conductive region is preferably less than about 200 nm thick, more preferably less than about 100 nm thick. These representative embodiments result in films that are sufficiently transparent to allow incident light to reach the absorber region 20). Preferably, the transparent conductive layer is a transparent conductive oxide. As used herein, the term "metal" refers not only to metals, but also to metal admixtures such as alloys, intermetallic compositions, combinations of these, and the like. These metal compositions optionally may be doped. Examples of metals that could be used to form thin, optically transparent layers 30 include the metals suitable for use in the backside electrical contact 28, combinations of these, and the like.

Support 26 may be rigid or flexible, but desirably is flexible in those embodiments in which the device 10 may be used in combination with non-flat surfaces. Support 26 may be formed from a wide range of materials. These include glass, quartz, other ceramic materials, polymers, metals, metal alloys, intermetallic compositions, paper, woven or non-woven fabrics, combinations of these, and the like. Stainless steel is preferred.

The backside electrical contact region 28 provides a convenient way to electrically couple device 10 to external circuitry. Backside electrical contact region 28 may be formed from a wide range of electrically conductive materials, including one or more of Cu, Mo, Ag, Al, Cr, Ni, Ti, Ta, Nb, W combinations of these, and the like. Conductive compositions incorporating Mo may be used in an illustrative embodiment. The backside electrical contact region 28 also helps to isolate the absorber region 20 from the support to minimize migration of support constituents into the absorber layer. For instance, backside electrical contact region 28 can help to block the migration of Fe and Ni constituents of a stainless steel support 26 into the absorber region 20. The backside electrical contact region 28 also can protect the support 26 such as by protecting against Se if Se is used in the formation of absorber region 20.

Device 10 comprises electrically conductive collector component, preferably an electrically conductive grid structure 30 comprising one or more electrical contacts 32 in electrical contact with TC region 24. The grid structure 30 may be deposited over the TC region to reduce the sheet resistance of this layer. Electrical contacts 32 can be formed from a wide range of electrically conducting materials, but most desirably are formed from one or more metals, metal alloys, or intermetallic compositions. Exemplary contact materials include one or more of Ag, Al, Cu, Cr, Ni, Ti, combinations of these, and the like. Contacts 32 incorporating Ag are preferred.

To improve the adhesion quality of the interface between the contacts 32 and the TC region 24, an optional adhesion promoting film (not shown) may be used at all or a portion of the interface between the contacts 32 and the TC region 24. In a typical embodiment, the adhesion promoting film has a thickness in the range from about 10 nm to about 500 nm, preferably about 25 nm to about 250 nm, more preferably about 50 nm to about 100 nm. The adhesion promoting film can be formed from a wide range of materials. Preferred embodiments of the adhesion promoting film incorporate electrically conductive metal constituents such as Ni. The adhesion promoting is formed prior to deposition of contacts 32 on TC region 24.

FIGS. 2-5 schematically show alternative embodiments of photovoltaic devices 10A, 10B, 10C, and 10D, respectively, of the present invention in which each support, 18A-18D, respectively, incorporates additional layers and/or combinations of layers. In particular, FIGS. 2-5 show the addition of a buffer region 34. As shown, buffer region 34 can be positioned below the first barrier region 22 (FIGS. 2, 4, and 5) or above the first barrier region 22 (FIG. 3). Also, as shown, buffer region 34 can be a single integral layer as illustrated or can be formed from one or more layers. Illustrative buffer layer embodiments generally may have a thickness in the range from about 10 nm to about 200 nm.

A wide range of n-type semiconductor materials may be used to form buffer region 34. Illustrative materials include selenides, sulfides, and/or oxides of one or more of cadmium, zinc, lead, indium, tin, combinations of these and the like, optionally doped with materials including one or more of fluorine, sodium, combinations of these and the like. In some illustrative embodiments, buffer region 34 is a selenide and/or sulfide including cadmium and optionally at least one other metal such as zinc. Other illustrative embodiments would include sulfides and/or selenides of zinc. Additional illustrative embodiments may incorporate oxides of tin doped with material(s) such as fluorine. A wide range of methods, such as for example, chemical bath deposition, partial electrolyte treatment, evaporation, sputtering, or other deposition technique, can be used to form buffer region 34.

Substrate 18 may also include an optional window region 36. See FIGS. 4-5. As shown, window region 36 can be can be a single integral layer as illustrated or can be formed from one or more layers. Window region 36 can help to protect against shunts. Window region 36 also may protect buffer region 34 during subsequent deposition of the TC region 24. The window region 36 may be formed from a wide range of materials and often is formed from a resistive, transparent oxide such as an oxide of Zn, In, Cd, Sn, combinations of these and the like. An exemplary window material is intrinsic ZnO. A typical window region 36 may have a thickness in the range from about 10 nm to about 200 nm, preferably about 50 nm to about 150 nm, more preferably about 80 nm to about 120 nm.

Figure 5:
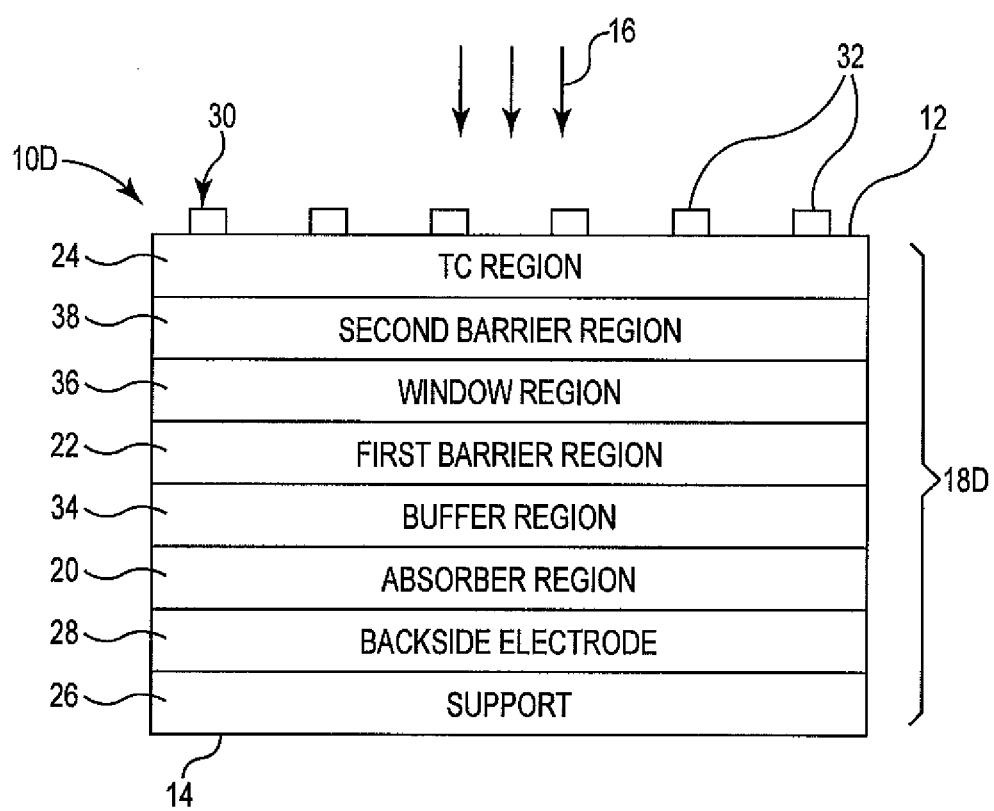

FIG. 5 shows the inclusion of another optional region, here an additional or second barrier region 38, to help further protect device 10. Preferably, second barrier region is a dielectric barrier region. In the mode of practice shown in FIG. 5, the second barrier layer is incorporated into device 10D before grid 30 is applied. In other modes of practice, the additional barrier layer or layers 38 may be incorporated into device 10 after desired electrical connections are made to grid 30. If an optional region is used as a top layer on the device (not shown), the top surface of the device may be coated with an adhesion promoting film (not shown).

The second barrier region 38 may be formed from the same materials used in the first barrier region 22. These materials may also include other metal oxides, carbides, nitrides and the like or combinations thereof in addition to those that are used in the first barrier region 22. In one preferred embodiment, the material of the second barrier region is an oxide and/or nitride of silicon. These embodiments provide excellent dielectric and additional moisture protection. In some embodiments, second barrier region 38 is formed from silicon nitride or a material incorporating silicon, nitrogen, and oxygen (a silicon oxy nitride). In other embodiments in the second barrier region 34 may be formed from two or more sublayers, a first sublayer may be formed from silicon nitride, and a second sublayer may be formed from a silicon oxy nitride.

Representative embodiments of silicon nitride may be represented by the formula $SiN_x$, and representative embodiments of silicon oxy nitride may be represented by the formula $SiO_yN_z$, wherein x is in the range from about 1.2 to about 1.5, preferably about 1.3 to about 1.4; y is preferably in the range from greater than 0 to about 0.8, preferably from about 0.1 to about 0.5; and z is in the range from about 0.8 to about 1.4, preferably about 1.0 to about 1.3. Desirably, x, y, and z are selected so that the barrier region 34, or each sublayer thereof as appropriate, has a refractive index in the range from about 1.80 to about 3. As an example of one suitable embodiment, silicon nitride of the formula $SiN_{1.3}$ and having a refractive index of 2.03 would be suitable in the practice of the present invention.

Other representative embodiments of the second barrier region include oxides of Ti or Sn, represented by the formulae $TiO_2$ and $SnO_2$, respectively.

Preferred embodiments of the second barrier region 38 exhibit optical transmittance ≥80% in the transmission wavelength range from about 400 nm to about 1300 nm and preferably exhibit ≥85% transmission in the same range. Additionally, preferred embodiments of the dielectric barrier region 34 may exhibit a water vapor transmission rate less than about $1 \times 10^{-4}$ g/m$^2$·day and preferably less than about $5 \times 10^{-4}$ g/m$^2$·day. In addition to protection against moisture vapor ingress, the second barrier region may also function as a barrier to elemental migration, preventing in particular the migration of Na, Li or Ln elements from the device. The dielectric barrier region 34 can be applied as a single layer or as multiple sublayers.

Second barrier region 38 may have a wide range of thicknesses. If too thin, then the electric insulating properties and protection against moisture intrusion may not be as robust as might be desired. If too thick, then transparency may unduly suffer without providing sufficient extra performance. Balancing these concerns, illustrative embodiments of second barrier region 38 may have a thickness in the range of 10 nm to about 1000 nm, preferably about 10 nm to about 250 nm, more preferably about 50 nm to about 150 nm.

The present invention will now be described with reference to the following illustrative examples.

EXAMPLE 1

Transparent Tin Oxide Barrier between CIGS and ITO Conductive Layer

Photovoltaic devices according to the invention can be prepared on 2" square soda-lime glass substrates, 0.7 mm thick. A layer of molybdenum can be sputter deposited at 200 W, $6e10^{-3}$ mbar on the glass substrate, to a final thickness of about 750-800 nm. CIGS absorber layer can be deposited by a single-stage metal co-evaporation process based on a multi-stage process practiced by NREL (Repins, 2008). A $SnO_2$ layer can be prepared in a custom DC magnetron sputter chamber, depositing at 250 W, from a 125 mm diameter, 5 mm thick stoichiometric $SnO_2$ ceramic target using gas flows of argon (40 sccm) and oxygen (2 sccm), controlled using mass flow controllers, to achieve a working gas pressure of 5.0 mTorr. The substrate temperature can be held at room temperature during the deposition and the final film thickness was around 100 nm. Indium tin oxide (ITO) films can be prepared using a custom RF magnetron sputter chamber from a 100 mm diameter, 5 mm thick ITO ceramic target (90 wt % $In_2O_3$, 10 wt % $SnO_2$) using gas flows of argon (14 sccm) and oxygen (2 sccm), controlled using mass flow controllers, to achieve a working gas pressure of 2.8 mTorr. The substrate temperature can be held at 150° C. during the ITO deposition and the final film thickness is around 150 nm. Layers of Ni and then Ag having a total thickness of about 1600 nm can be sequentially evaporated over a mask, thus depositing a conductive grid that covers the exposed ITO completely. The Ni and Ag layers are deposited sequentially by E-beam evaporation in a Denton Explorer 14 system. Prior to evaporation, the chamber base pressure is reduced to $<2e10^{-6}$ Torr. All depositions can be carried out at 9.0 kV, while current values are 0.130 and 0.042 Amps for Ni and Ag, respectively. The deposition rates can be controlled in process using a Maxtek 260 quartz crystal deposition controller at 2.0 Å/s and 15.0 A/ls for Ni and Ag, respectively. Ni shots (99.9999%, obtained from International Advanced Materials) can be evaporated from a 7 cc graphite crucible, while Ag pellets (99.9999%, Alfa Aesar) can be evaporated from a 7 cc molybdenum crucible. A device so made is anticipated to have improved performance relative to an equivalent device lacking the barrier layer.

EXAMPLE 2

Transparent Tin Oxide Barrier between Buffer and ITO Conductive Layer

Photovoltaic devices according to the invention can be prepared on 2" square soda-lime glass substrates, 0.7 mm thick. A layer of molybdenum can be sputter deposited at 200 W, $6e10^{-3}$ mbar on the glass substrate, to a final thickness of about 750-800 nm. CIGS absorber layer can be deposited by a single-stage metal co-evaporation process based on a multi-stage process practiced by NREL (Repins, 2008). A cadmium sulfide buffer layer can be deposited by chemical bath deposition (CBD) by dipping samples into a mixture of 33 mL 0.015 M $CdSO_{4(aq)}$ and 42 mL 14.5 M $NH_4OH_{(aq)}$ (concentrated $NH_3$) at 70° C. After 1 min. 33 mL of 0.75 mL thiourea can be added and the reaction was allowed to proceed for 7 min. Samples can be dried at 110° C. for 30 min. A $SnO_2$ layer can be prepared in a custom DC magnetron sputter chamber, depositing at 250 W, from a 125 mm diameter, 5 mm thick stoichiometric $SnO_2$ ceramic target using a gas ratio of 5% oxygen to argon, to achieve a working gas pressure of 5.0 mTorr. The substrate temperature can be held at room temperature during the deposition and the final film thickness was around 100 nm. Indium tin oxide (ITO) films can be prepared using a custom RF magnetron sputter chamber from a 100 mm diameter, 5 mm thick ITO ceramic target (90 wt % $In_2O_3$, 10 wt % $SnO_2$) using gas flows of argon (14 sccm) and oxygen (2 sccm), controlled using mass flow controllers, to achieve a working gas pressure of 2.8 mTorr. The substrate temperature can be held at 150° C. during the ITO deposition and the final film thickness is around 150 nm. Layers of Ni and then Ag having a total thickness of about 1600 nm can be sequentially evaporated over a mask, thus depositing a conductive grid that covers the exposed ITO completely. The Ni and Ag layers are deposited sequentially by E-beam evaporation in a Denton Explorer 14 system. Prior to evaporation, the chamber base pressure is reduced to $<2 \times 10^{-6}$ Torr. All depositions can be carried out at 9.0 kV, while current values are 0.130 and 0.042 Amps for Ni and Ag, respectively. The deposition rates can be controlled in process using a Maxtek 260 quartz crystal deposition controller at 2.0 Å/s and 15.0 AA for Ni and Ag, respectively. Ni shots (99.9999%, obtained from International Advanced Materials) can be evaporated from a 7 cc graphite crucible, while Ag pellets (99.9999%, Alfa Aesar) can be evaporated from a 7 cc molybdenum crucible. A device so made is anticipated to have improved performance relative to an equivalent device lacking the barrier layer.

EXAMPLE 3

Transparent Tin Oxide Barrier between ITO Conductive Layer and Front Side Electrical Grid Photovoltaic devices according to the invention can be prepared on 2" square soda-lime glass substrates, 0.7 mm thick. A layer of molybdenum can be sputter deposited at 200 W, $6e10^{-3}$ mbar on the glass substrate, to a final thickness of about 750-800 nm. CIGS absorber layer can be deposited by a multi-stage metal co-evaporation process based on a three-stage process practiced by NREL (Repins, 2008). A cadmium sulfide buffer layer can be deposited by chemical bath deposition (CBD) by dipping samples into a mixture of 33 mL 0.015 M $CdSO_{4(aq)}$ and 42 mL 14.5 M $NH_4OH_{(aq)}$ (concentrated $NH_3$) at 70° C. After 1 min. 33 mL of 0.75 mL thiourea was added and the reaction was allowed to proceed for 7 min. Samples can be dried at 110° C. for 30 min. The window layer, i-ZnO, can be prepared by RF magnetron sputtering of a ZnO target at 60 W and 10 mtorr sputtering pressure (0.15% $O_2$ in Ar sputtering gas) to a final thickness of about 70 nm. Indium tin oxide (ITO) films can be prepared using a custom RF magnetron sputter chamber from a 100 mm diameter, 5 mm thick ITO ceramic target (90 wt % $In_2O_3$, 10 wt % $SnO_2$) using gas flows of argon (14 sccm) and oxygen (2 sccm), controlled using mass flow controllers, to achieve a working gas pressure of 2.8 mTorr. The substrate temperature can be held at 150° C. during deposition, the final film thickness is around 150 nm. A $SnO_2$ layer can be prepared in a custom DC magnetron sputter chamber, depositing at 250 W, from a 125 mm diameter, 5 mm thick stoichiometric $SnO_2$ ceramic target using a gas ratio of 5% oxygen to argon, to achieve a working gas pressure of 5.0 mTorr. The substrate temperature can be held at room temperature during the deposition and the final film thickness was around 450 nm. Layers of Ni and then Ag having a total thickness of about 1600 nm can be sequentially evaporated over a mask, thus depositing a conductive grid that covers the exposed $SnO_2$ completely. The Ni and Ag layers are deposited sequentially by E-beam evaporation on a Denton Explorer 14 system. Prior to evaporation, the chamber base pressure is reduced to $<2e10^{-6}$ Torr. All depositions can be carried out at 9.0 kV, while current values are 0.130 and 0.042 Amps for Ni and Ag, respectively. The deposition rates can be controlled in process using a Maxtek 260 quartz crystal deposition controller at 2.0 Å/s and 15.0 Å/s for Ni and Ag, respectively. Ni shots (99.9999%, obtained from International Advanced Materials) can be evaporated from a 7 cc graphite crucible, while Ag pellets (99.9999%, Alfa Aesar) can be evaporated from a 7 cc molybdenum crucible. A device so made is anticipated to have improved performance relative to an equivalent device lacking the barrier layer.

TABLE I

Example 3 damp-heat performance results

| Hrs | Efficiency of devices with $SnO_2$ (Sample size of 25) | Efficiency of control devices without $SnO_2$ (Sample size of 30) |
| --- | --- | --- |
| 0 | 9.4 ± 1.2 | 11.1 ± 1.0 |
| 24 | 9.7 ± 0.9 | 2.4 ± 0.9 |
| 48 | 9.4 ± 0.8 | 1.4 ± 0.5 |
| 72 | 8.6 ± 2.3 | 1.0 ± 0.4 |
| 96 | 7.7 ± 2.7 | 0.8 ± 0.3 |
| 120 | 6.9 ± 3.0 | 0.7 ± 0.2 |
| 144 | 6.6 ± 2.8 | 0.6 ± 0.2 |
| 240 | 5.5 ± 2.4 | 0.6 ± 0.2 |

Samples were fabricated as described in example 3. These samples were exposed to damp-heat (85° C./85% RH) in a controlled BlueM Humidity Oven. IV characteristics were collected on the samples before damp-heat exposure. The samples were then exposed to the damp-heat environment for the time period specified and then IV characteristics were collected. The IV characteristic measurements were collected on a Class AAA steady-state solar simulator under AM1.5 standard conditions. Control samples, which received no $SnO_2$ treatment, were also evaluated. As shown in Table I above the samples that received an $SnO_2$ layer clearly outperformed the samples that did not receive an $SnO_2$ layer. The samples that received an $SnO_2$ layer showed no measurable loss in efficiency after 48 hrs exposure to damp-heat. Following subsequent exposure to damp-heat the $SnO_2$ treated cell performance degraded, but at a significantly reduced rate relative to the control samples.

EXAMPLES 4-6

Devices are made substantially according Examples 1-3 except that instead of depositing a $SnO_2$ a $TaN_x$ layer is deposited. The $TaN_x$ layer is prepared using a custom RF magnetron sputter chamber from a 50 mm diameter, 6.4 mm thick Ta target using $N_2$ sputtering gas. $TaN_x$ films are deposited over a three-minute period at a power of 140 watts and a pressure of 4 mTorr. The base pressure prior to deposition is less than $1.0 \times 10^{-5}$ torr. Under these conditions a $TaN_x$ layer with thickness of approximately 20 nm is formed. Devices so made are anticipated to have improved performance relative to an equivalent device lacking the barrier layer.

What is claimed is:
1. A photovoltaic device comprising:
   a) a substrate comprising a backside electrical contact for the device;
   b) at least one chalcogenide-containing photovoltaic absorber layer, the chalcogenide-containing absorber layer incorporating at least one constituent selected from sodium (Na), lithium (Li), and the lanthanoid series (Ln), or a combination thereof which absorber layer is electrically connected to the backside electrical contact;
   c) a frontside electrical collector, wherein the frontside electrical collector comprises a front side collection grid comprising at least one front side electrical contact located over and electrically connected to a transparent conductive layer; and
   d) a first transparent barrier layer located between the absorber layer and the frontside electrical collector, wherein the first transparent barrier layer comprises material chosen from a nitride, a carbide, and combinations thereof of Sn and/or a nitride, a carbide, an oxide, and combinations thereof of Ta, wherein the first transparent barrier layer has a thickness in the range of from greater than 50 nm to less than 200 nm, and wherein the first transparent barrier layer is located between the chalcogenide-containing absorber layer and the transparent conductive layer or between the transparent conductive layer and the front side collection grid.

2. The photovoltaic device of claim 1, further comprising a second barrier layer.

3. The photovoltaic device of claim 1, wherein the chalcogenide-containing absorber comprises at least copper and indium and optionally gallium.

4. The photovoltaic device of claim 1 further comprising a buffer layer positioned between the absorber and the transparent conductive layer, wherein the first transparent bather layer is interposed between a buffer layer and the transparent conductive layer or between the chalcogenide absorber layer and the buffer layer.

5. The photovoltaic device of claim 4, wherein a window layer is positioned between the absorber and the transparent conductive layer.

6. The photovoltaic device of claim 5, wherein the first transparent barrier layer is interposed between a buffer layer and a window layer.

7. The photovoltaic device of claim 1, wherein the first transparent barrier layer has a transmittance of light at least 80% for wavelengths between 400 nm and 1300 nm.

8. The photovoltaic device of claim 1, wherein the first transparent barrier layer has a resistivity in the range of 0.01 to 100 Ohm-cm.

9. The photovoltaic device of claim 1, wherein the first transparent barrier layer has a water vapor transmission rate in the range of $10^0$ to $10^{-5}$ g/m$^2$·day.

10. The photovoltaic device of claim 1, wherein the transparent conductive layer comprises a transparent conducting oxide.

11. A method comprising the steps of:
a) providing a substrate having a light incident surface and a backside surface, the backside surface having a backside electrical contact thereon, the substrate further having at least one chalcogenide-containing photovoltaic absorber layer electrically connected to the backside electrical contact, the chalcogenide-containing absorber layer incorporating at least one constituent selected from Na, Li, one of the lanthanoid series of elements (Ln) or a combination thereof;
b) causing at least one transparent conductive layer to be formed over the chalcogenide-containing absorber layer;
c) forming a front side collection grid comprising at least one front side electrical contact on the light incident surface, the front side collection grid being electrically connected to the transparent conductive layer; and
d) causing a first transparent bather layer to be formed between the chalcogenide-containing absorber layer and the transparent conductive layer or between the transparent conductive layer and the front side collection grid, the first transparent barrier layer inhibiting migration of the at least one constituent selected from Na, Li, Ln, or a combination thereof from the chalcogenide-containing absorber layer, wherein the first transparent barrier layer comprises material chosen from a nitride, a carbide, and combinations thereof of Sn and/or a nitride, a carbide, an oxide, and combinations thereof of Ta, and wherein the first transparent barrier layer has a thickness in the range of from greater than 50 nm to less than 200 nm.

12. The method of claim 11, wherein the first transparent barrier layer has a transmittance of at least 80% between 400 nm and 1300 nm.

13. The method of claim 11, wherein the first transparent barrier layer has a resistivity in the range of 0.01 to 100 Ohm-cm.

14. The method of claim 11, wherein the first transparent barrier layer has a water vapor transmission rate in the range of $10^0$ to $10^{-5}$ g/m$^2$·day.

\* \* \* \* \*

UNITED STATES PATENT AND TRADEMARK OFFICE
CERTIFICATE OF CORRECTION

| | | |
|---|---|---|
| PATENT NO. | : 8,604,336 B2 | Page 1 of 1 |
| APPLICATION NO. | : 13/005422 | |
| DATED | : December 10, 2013 | |
| INVENTOR(S) | : Rebekah K. Feist et al. | |

It is certified that error appears in the above-identified patent and that said Letters Patent is hereby corrected as shown below:

In the Claims:

<u>Column 12</u>
Line 55 "bather" should be -- barrier --

<u>Column 14</u>
Line 1 "bather" should be -- barrier --

Signed and Sealed this
Twenty-second Day of July, 2014

Michelle K. Lee
*Deputy Director of the United States Patent and Trademark Office*